(12) United States Patent
Cheng et al.

(10) Patent No.: US 8,999,791 B2
(45) Date of Patent: Apr. 7, 2015

(54) FORMATION OF SEMICONDUCTOR STRUCTURES WITH VARIABLE GATE LENGTHS

(71) Applicant: International Business Machines Corporation, Armonk, NY (US)

(72) Inventors: Kangguo Cheng, Schenectady, NY (US); Bruce B. Doris, Brewster, NY (US); Ali Khakifirooz, Mountain View, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/886,909

(22) Filed: May 3, 2013

(65) Prior Publication Data

US 2014/0329380 A1    Nov. 6, 2014

(51) Int. Cl.
*H01L 21/8234*    (2006.01)
*H01L 21/28*    (2006.01)
*H01L 29/66*    (2006.01)

(52) U.S. Cl.
CPC .... *H01L 21/28008* (2013.01); *H01L 21/28123* (2013.01); *H01L 29/66545* (2013.01); *H01L 21/823456* (2013.01)

(58) Field of Classification Search
CPC ................. H01L 21/28123; H01L 21/823456; H01L 21/82385; H01L 29/66545; H01L 29/66871
USPC .................................. 438/275, 279, 304, 596
See application file for complete search history.

(56) References Cited

U.S. PATENT DOCUMENTS

| | | | | |
|---|---|---|---|---|
| 4,419,809 A | * | 12/1983 | Riseman et al. | 438/231 |
| 4,735,916 A | * | 4/1988 | Homma et al. | 438/234 |
| 5,148,244 A | | 9/1992 | Iwasaki | |
| 6,008,096 A | * | 12/1999 | Gardner et al. | 438/300 |
| 6,261,964 B1 | * | 7/2001 | Wu et al. | 438/705 |
| 6,383,872 B1 | * | 5/2002 | Kadosh et al. | 438/279 |
| 6,617,085 B1 | | 9/2003 | Kanh et al. | |
| 6,703,312 B2 | | 3/2004 | Golz et al. | |

(Continued)

OTHER PUBLICATIONS

Koblinger, O., et al., "Simultaneous Precise Generation of Different FET Channel Lengths During the Sidewall Image Transfer Process", Original Publication Date: Jul. 1, 1988, IBM TDB 07-88, p. 36-37.

*Primary Examiner* — Fernando L. Toledo
*Assistant Examiner* — Bryan Junge
(74) *Attorney, Agent, or Firm* — Scully, Scott, Murphy & Presser, P.C.; Daniel P. Morris, Esq.

(57) ABSTRACT

A plurality of doped sacrificial semiconductor material portions of a first width and a plurality of doped sacrificial semiconductor material portions of a second width, which is different from the first width, are provided on a sacrificial gate dielectric material. Exposed portions of the sacrificial dielectric material are removed. A dielectric material is formed adjacent each doped sacrificial semiconductor material portion such that an upper surface of each doped sacrificial semiconductor material portion is exposed. Each doped sacrificial semiconductor material portion is removed providing a first set of gate cavities having the first width and a second set of gate cavities having the second width. Each gate cavity is filled with a gate structure. The gate structures formed in the first set of gate cavities have the first width, while the gate structure formed in the second set of gate cavities have the second width.

20 Claims, 6 Drawing Sheets

(56) References Cited

U.S. PATENT DOCUMENTS

| | | |
|---|---|---|
| 6,828,634 B2 | 12/2004 | Oshima |
| 7,023,055 B2 | 4/2006 | Ieong et al. |
| 7,084,025 B2* | 8/2006 | Phua et al. ............ 438/199 |
| 7,129,152 B2* | 10/2006 | Fehlhaber et al. ........... 438/483 |
| 7,329,923 B2 | 2/2008 | Doris et al. |
| 7,687,339 B1 | 3/2010 | Schultz et al. |
| 7,838,371 B2* | 11/2010 | Doornbos et al. ............ 438/299 |
| 2003/0107088 A1* | 6/2003 | Inumiya et al. ............... 257/368 |
| 2005/0116290 A1 | 6/2005 | de Souza et al. |
| 2007/0292996 A1* | 12/2007 | Abadeer et al. ............... 438/165 |
| 2011/0021010 A1* | 1/2011 | Cheng et al. ................ 438/513 |
| 2012/0295441 A1* | 11/2012 | Hong ............................ 438/683 |
| 2013/0102136 A1* | 4/2013 | Hsieh et al. ................... 438/510 |

* cited by examiner

US 8,999,791 B2

FORMATION OF SEMICONDUCTOR STRUCTURES WITH VARIABLE GATE LENGTHS

BACKGROUND

The present application relates to semiconductor device manufacturing, and more particularly, to a method of forming a semiconductor structure having variable gate lengths.

In order to be able to make integrated circuits (ICs), such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device while maintaining the device's electrical properties.

SUMMARY

The present application provides a method for forming multiple gate lengths which does not include double lithography exposure or an SIT process. Notably, a plurality of doped sacrificial semiconductor material portions of a first width and a plurality of doped sacrificial semiconductor material portions of a second width, which is different from the first width, are provided on a sacrificial dielectric material and in different active device regions of a semiconductor substrate. Exposed portions of the sacrificial dielectric material are removed. A dielectric material is formed adjacent each doped sacrificial semiconductor material portion such that an upper surface of each doped sacrificial semiconductor material portion is exposed. Each doped sacrificial semiconductor material portion is removed providing a first set of gate cavities having the first width and a second set of gate cavities having the second width. Each gate cavity is filled with a gate structure. The gate structures formed in the first set of gate cavities have the first width, while the gate structure formed in the second set of gate cavities have the second width.

In one aspect of the present application, a method of forming a semiconductor structure is provided. The method of the present application includes providing a structure comprising a semiconductor substrate having a first active device region and a second active device region, and a sacrificial dielectric material located on an upper surface of the semiconductor substrate in the first active device region and the second active device region. Next, a non-doped sacrificial semiconductor material portion having a first doped sacrificial semiconductor material portion of a first width located on each sidewall of the non-doped sacrificial semiconductor material portion is formed on a portion of the sacrificial dielectric material and in the first active device region, and another non-doped sacrificial semiconductor material portion having a second doped sacrificial semiconductor material portion of a second width located on each sidewall of the another non-doped sacrificial semiconductor material portion is formed on another portion of the sacrificial dielectric material and in the second active device region. In accordance with the present application, the second width is different than the first width.

The non-doped sacrificial semiconductor material portion and the another non-doped sacrificial semiconductor material portion are then removed selective to each first doped sacrificial semiconductor material portion and each second doped sacrificial semiconductor material portion. Exposed portions of the sacrificial dielectric material not covered by each first doped sacrificial semiconductor material portion in the first active device region and each second first doped sacrificial semiconductor material portion in the second active device region are then removed. At least a dielectric material is formed adjacent each first doped sacrificial semiconductor material portion and each second doped sacrificial semiconductor material portion, wherein the dielectric material has an upper surface that is coplanar with an upper surface of each first doped sacrificial semiconductor material portion and each second doped sacrificial semiconductor material portion. Each first doped sacrificial semiconductor material portion and underlying sacrificial dielectric material is removed from the first active device region providing first gate cavities having the first width, and each second doped sacrificial semiconductor material portion and underlying sacrificial dielectric material from the second active device region is removed providing second gate cavities having the second width. Next, a gate structure is formed in each of the first gate cavities and the second gate cavities.

DETAILED DESCRIPTION

Figure 1:
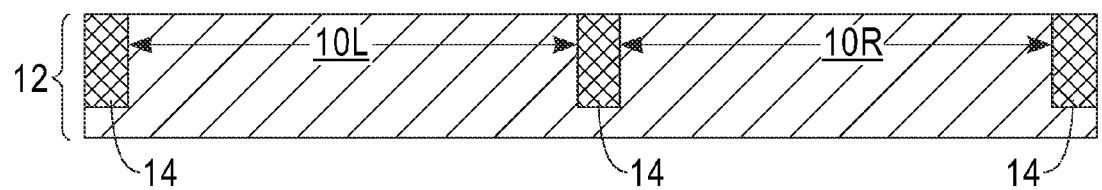
FIG. 1 is a pictorial representation (through a cross sectional view) illustrating a semiconductor substrate having a first active device region and a second active device region defined therein that can be employed in accordance with one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Continued scaling of FET technology requires gate pitch scaling. Presently, a double lithography exposure technique and a sidewall image transfer (SIT) technique are known methods which can pattern small gate pitches. Both of these prior art techniques have drawbacks associated with them. For example, double lithography exposure requires two masks and two exposures which increase the cost of forming ICs including scaled MOSFETs and CMOS. SIT can only form a single gate length. If multiple gate lengths are needed, one has to deposit SIT spacers twice and a block mask for removing the second spacer from one region. If more than two gate lengths are needed, the SIT spacer deposition/patterning technique becomes too complicated to practice. There is a need for providing a method for forming multiple gate lengths on the same semiconductor substrate that avoids the drawbacks associated with prior art double lithography exposure and SIT.

Referring first to FIG. 1, there is illustrated a semiconductor substrate 12 having a first active device region 10L and a second active device region 10R defined therein that can be employed in accordance with one embodiment of the present application. The first active device region 10L may be separated from the second active device region 10R by an isolation region 14. Although two active device regions 10L, 10R are described and illustrated, the present application can be practice with more than two active regions. The structure that is shown in FIG. 1 can be used in forming planar semiconductor devices.

In another embodiment of the present disclosure, not shown, the active device regions can be defined by forming a plurality of semiconductor fins in a topmost semiconductor layer of a semiconductor-on-insulator substrate utilizing techniques known to those skilled in the art. A portion of each fin that is formed can be used as a semiconductor body of a non-planar semiconductor device such, as for example, a finFET.

In some embodiments of the present application, the semiconductor substrate 12 can be a bulk semiconductor substrate. When a bulk semiconductor substrate is employed as semiconductor substrate 12, the bulk semiconductor substrate can be comprised of any semiconductor material including, but not limited to, Si, Ge, SiGe, SiC, SiGeC, InAs, GaAs, InP or other like III/V compound semiconductors. Multilayers of these semiconductor materials can also be used as the semiconductor material of the bulk semiconductor. In one embodiment, the semiconductor substrate 12 can be comprised of a single crystalline semiconductor material, such as, for example, single crystalline silicon. In other embodiments, the semiconductor substrate 12 may comprise a polycrystalline or amorphous semiconductor material.

In another embodiment, a semiconductor-on-insulator (SOI) substrate (not specifically shown) can be employed as the semiconductor substrate 12. Although not specifically shown, one skilled in the art understands that an SOI substrate includes a handle substrate, a buried insulating layer located on an upper surface of the handle substrate, and a semiconductor layer located on an upper surface of the buried insulating layer. In some embodiments, particularly when non-planar devices are being fabricated, the semiconductor layer of the SOI substrate can be processed into an active device region such as, for example, a semiconductor fin or a semiconductor nanowire.

The handle substrate and the semiconductor layer of the SOI substrate may comprise the same, or different, semiconductor material. The term "semiconductor" as used herein in connection with the semiconductor material of the handle substrate and the semiconductor layer denotes any semiconducting material including, for example, Si, Ge, SiGe, SiC, SiGeC, InAs, GaAs, InP or other like III/V compound semiconductors. Multilayers of these semiconductor materials can also be used as the semiconductor material of the handle substrate and the semiconductor layer. In one embodiment, the handle substrate and the semiconductor layer are both comprised of silicon. In some embodiments, the handle substrate is a non-semiconductor material including, for example, a dielectric material and/or a conductive material.

The handle substrate and the semiconductor layer may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the semiconductor layer of the SOI substrate may be a single crystalline semiconductor material, a polycrystalline material, or an amorphous material. Typically, at least the semiconductor layer is a single crystalline semiconductor material. In some embodiments, the semiconductor layer that is located atop the buried insulating layer can be processed to include semiconductor regions having different crystal orientations.

The buried insulating layer of the SOI substrate may be a crystalline or non-crystalline oxide or nitride. In one embodiment, the buried insulating layer is an oxide. The buried insulating layer may be continuous or it may be discontinuous. When a discontinuous buried insulating region is present, the insulating region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of the semiconductor layer of the SOI substrate is typically from 100 Å to 1000 Å, with a thickness from 500 Å to 700 Å being more typical. In some embodiments, and when an ETSOI (extremely thin semiconductor-on-insulator) substrate is employed, the semiconductor layer of the SOI has a thickness of less than 100 Å. If the thickness of the semiconductor layer is not within one of the above mentioned ranges, a thinning step such as, for example, planarization or etching can be used to reduce the thickness of the semiconductor layer to a value within one of the ranges mentioned above. The buried insulating layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as semiconductor substrate 12. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Semiconductor substrate 12 may be doped, undoped or contain doped and undoped regions therein. For clarity, the doped regions are not specifically shown in the drawings of the present application. Each doped region within the semiconductor material may have the same, or they may have different conductivities and/or doping concentrations. The doped regions that are present in the semiconductor substrate 12 are typically referred to as well regions and they are formed utilizing a conventional ion implantation process or gas phase doping.

In some embodiments, and as shown in FIG. 1, the semiconductor substrate 12 can be processed to include at least one isolation region 14 therein. The at least one isolation region 14 can be a trench isolation region or a field oxide isolation region. The trench isolation region can be formed utilizing a conventional trench isolation process well known to those skilled in the art. For example, lithography, etching and filling of the trench with a trench dielectric such as an oxide may be used in forming the trench isolation region. Optionally, a liner may be formed in the trench prior to trench fill, a densification step may be performed after the trench fill and a planarization process may follow the trench fill as well. The field oxide isolation region may be formed utilizing a so-called local oxidation of silicon process. Note that the at least one isolation region 14 provides isolation between neighboring gate structure regions, typically required when the neighboring gates have opposite conductivities, i.e., nFETs and pFETs. As such, the at least one isolation region 14 separates an nFET device region from a pFET device region.

Figure 2:
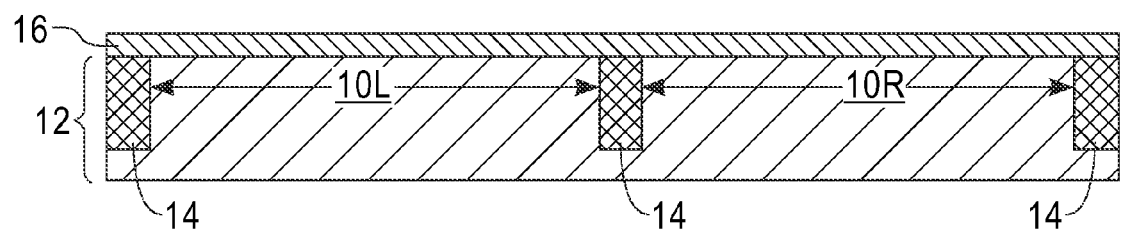
FIG. 2 is a pictorial representation (through a cross sectional view) illustrating the structure of FIG. 1 after forming a blanket layer of a sacrificial dielectric material on at least the uppermost surface of the semiconductor substrate.

Referring now to FIG. 2, there is illustrated the structure of FIG. 1 after forming a blanket layer of a sacrificial dielectric material 16 on at least the uppermost surface of the semiconductor substrate 12. In some embodiments, and as illustrated in FIG. 2, the blanket layer of sacrificial dielectric material 16 is also formed atop each isolation region 14. In other embodiments, the blanket layer of a sacrificial dielectric material 16 is formed only on the upper surface of the semiconductor substrate 12, but not the upper surface of the at least one isolation 14.

The blanket layer of sacrificial dielectric material 16 can be comprised of a dielectric material such as, for example, an oxide, nitride, and/or oxynitride. In one embodiment, the blanket layer of sacrificial dielectric material 16 can be comprised of silicon oxide, silicon nitride and/or silicon oxynitride. In one embodiment, the blanket layer of sacrificial dielectric material 16 can be formed utilizing a thermal process such as, for example, a thermal oxidation or a thermal nitridation process. In another embodiment, the blanket layer of sacrificial dielectric material 16 can be formed by a deposition process such as, for example, chemical vapor deposition (CVD), and plasma enhanced chemical vapor deposition (PECVD). The thickness of the blanket layer of sacrificial dielectric material 16 can be from 5 nm to 50 nm, although lesser and greater thicknesses can also be employed.

Figure 3:
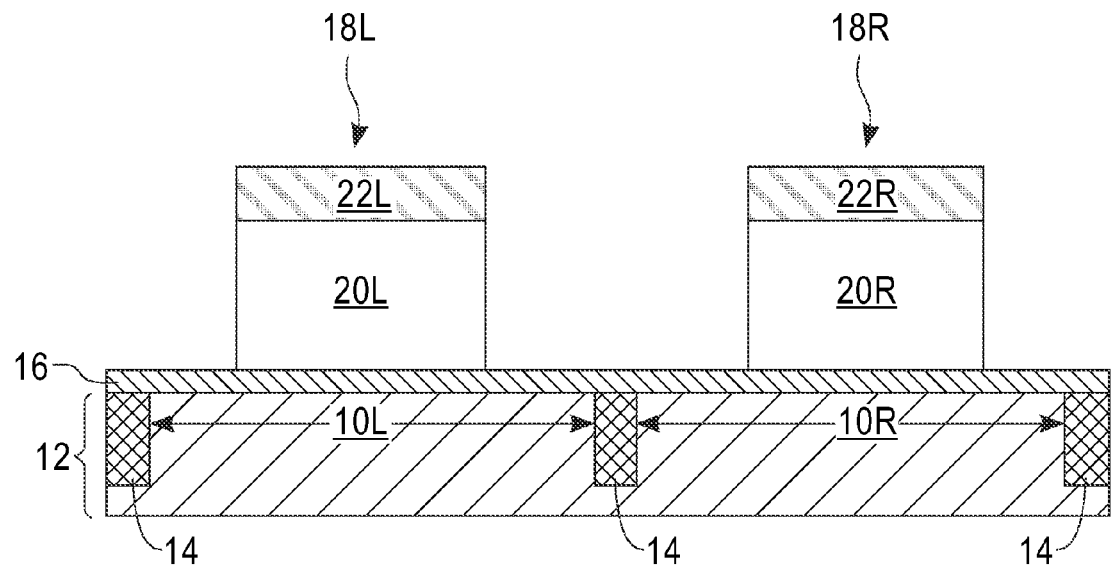
FIG. 3 is a pictorial representation (through a cross sectional view) illustrating the structure of FIG. 2 after forming a first patterned sacrificial material stack on a first surface portion of the sacrificial dielectric material and within the first active device region, and a second patterned sacrificial material stack on a second surface portion of the sacrificial dielectric material and within the second active device region.

Referring now to FIG. 3, there is illustrated the structure of FIG. 2 after forming a first patterned sacrificial material stack 18L on a first surface portion of the sacrificial dielectric material 16 and within the first active device region 10L, and a second patterned sacrificial material stack 18R on a second surface portion of the sacrificial dielectric material 16 and within the second active device region 10R. Although a single patterned sacrificial material stack 18L, 18R is described and illustrated in each active device region, the present application can be practiced with more than a single patterned sacrificial material stack formed within a respective active device region.

Each patterned sacrificial material stack 18L, 18R that is formed includes, from bottom to top, a non-doped sacrificial semiconductor material layer portion 20L, 20R, and a dielectric cap portion 22L, 22R. In some embodiments, the dielectric cap portion 22L, 22R can be omitted from atop each non-doped sacrificial semiconductor material layer portion 20L, 20R.

In one embodiment, the patterned sacrificial material stacks 18L, 18R can be formed by providing a sacrificial material stack comprising, from bottom to top, a blanket layer of non-doped sacrificial semiconductor material, and, optionally, a blanket layer of dielectric cap material. In one embodiment, of the present application, the blanket layer of non-doped sacrificial semiconductor material can include amorphous silicon; the term 'amorphous' denotes that the silicon layer lacks any long-range order characteristic of a crystal. In another embodiment of the present application, the blanket layer of non-doped sacrificial semiconductor material includes a silicon germanium alloy. Other types of semiconductor material can be used as the semiconductor material for providing the blanket layer of non-doped sacrificial semiconductor material so long as when portions of the semiconductor material are subsequently doped, the remaining non-doped sacrificial semiconductor material portions can be selectively removed relative to the doped semiconductor material portions. The blanket layer of non-doped sacrificial semiconductor material can be formed, for example, by chemical vapor deposition or plasma enhanced chemical vapor deposition. The thickness of the blanket layer of non-doped sacrificial semiconductor material can be from 50 nm to 300 nm, although lesser and greater thicknesses can also be employed.

Next, and if present, a blanket layer of dielectric cap material can be formed on an exposed surface of the blanket layer of non-doped sacrificial semiconductor material. The blanket layer of dielectric cap material can be comprised of a dielectric material such as, for example, an oxide, nitride, and/or oxynitride. The blanket layer of dielectric cap typically includes a different dielectric material than the sacrificial dielectric material 16. In one embodiment, the blanket layer of dielectric cap material can be comprised of silicon oxide, a silicon nitride and/or a silicon oxynitride. In one example, and when the sacrificial dielectric material 16 is comprised of silicon nitride, the blanket layer of dielectric cap material is comprised of silicon oxide. In one embodiment, the blanket layer of dielectric cap material can be formed utilizing a thermal process such as, for example, a thermal oxidation or a thermal nitridation process. In another embodiment, the blanket layer of dielectric cap material can be formed by a deposition process such as, for example, chemical vapor deposition (CVD), and plasma enhanced chemical vapor deposition (PECVD). The thickness of the blanket layer of dielectric cap material can be from 5 nm to 50 nm, although lesser and greater thicknesses can also be employed.

After forming the blanket layers of non-doped sacrificial semiconductor material, and optionally dielectric cap material, lithography and etching can be used to pattern the blanket layers of non-doped sacrificial semiconductor material, and optionally the dielectric cap material. Each remaining portion of the blanket layer of non-doped sacrificial semiconductor material that is not removed during the etch is referred to herein as non-doped sacrificial semiconductor material layer portion 20L, 20R, while each remaining portion of the blanket layer of dielectric cap material is referred to herein as dielectric cap portion 22L, 22R. The lithographic step can include forming a photoresist (not shown) on a surface of the blanket layer of dielectric cap material, if present, or the surface of the blanket layer of non-doped sacrificial semiconductor material, if the dielectric cap material is not present, exposing the photoresist to a desired pattern of radiation and then developing the exposed photoresist utilizing a conventional resist developer. The pattern within the photoresist is then transferred through the blanket layer of dielectric cap material, if present, and into the blanket layer of non-doped sacrificial semiconductor material. A single etch or multiple etching can be used to provide each patterned sacrificial material stack 18L, 18R. The etch or multiple etch can include a dry etch process, a chemical wet etch process, or any combination thereof. When a dry etch is used, the dry etch can be a reactive ion etch process, a plasma etch process, ion beam etching or laser ablation. The patterned photoresist material can be removed anytime after transferring the pattern into at least the blanket layer of dielectric cap material utilizing a conventional stripping process.

Each of the patterned sacrificial material stacks 18L, 18R that is formed has a relaxed gate pitch. By 'relaxed gate pitch" it is meant that each patterned sacrificial material gate stacks 18L, 18R that is formed has a greater pitch than the final pitch of the resultant gate structure. In one embodiment, a relaxed gate pitch that is two times greater than the final gate pitch is provided. A relaxed gate pitch is used in the present application to denote 80 nm to 300 nm.

Figure 4:
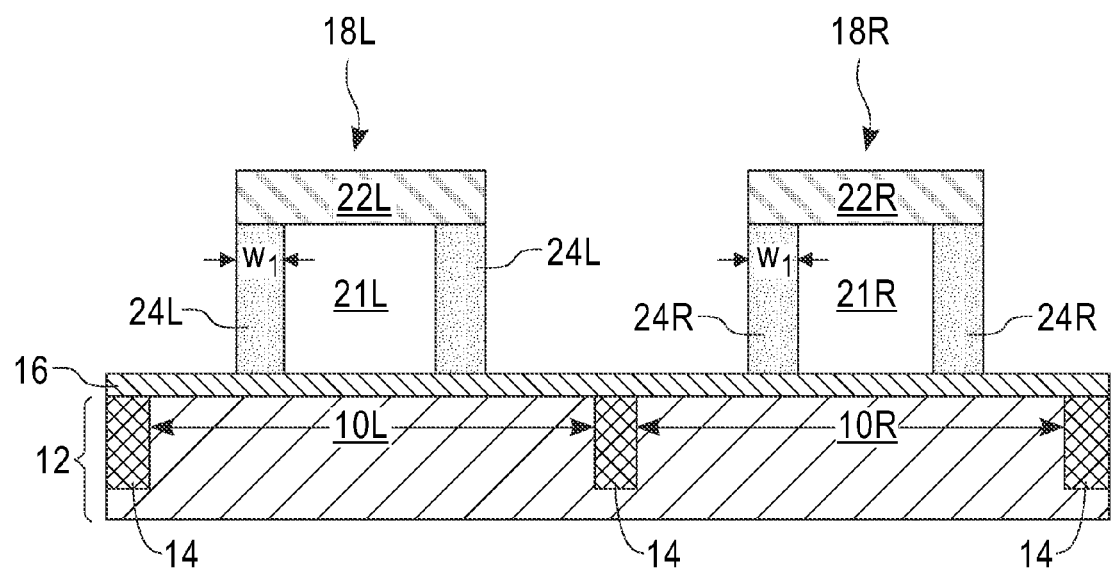
FIG. 4 is a pictorial representation (through a cross sectional view) illustrating the structure of FIG. 3 after forming doped sacrificial semiconductor material portions having a first width within sidewall portions of a non-doped semiconductor material layer portion of each of the first and second patterned material stacks.

Referring to FIG. 4, there is illustrated the structure of FIG. 3 after forming doped sacrificial semiconductor material portions 24L, 24R having a first width within sidewall portions of each non-doped sacrificial semiconductor material layer portion 20L, 20R of each of the first and second patterned material stacks 18L, 18R. The doped sacrificial semiconductor material portions 24L, 24R provide a shell which encases a remaining non-doped sacrificial semiconductor material portion 21L, 21R of the original non-doped sacrificial semiconductor material layer portion 20L, 20R. The doped sacrificial semiconductor material portions 24L, 24R and the remaining non-doped sacrificial semiconductor material portions 21L, 21R comprise a same semiconductor material as the non-doped sacrificial semiconductor material layer portion 20L, 20L. If dielectric cap portions 22L, 22R are present, the doped sacrificial semiconductor material portions 24L, 24R extend beneath the bottommost surface of each dielectric cap portions 22L, 22R as shown in FIG. 4.

The doped sacrificial semiconductor material portions 24L, 24R having a first width, w1, can be formed by subjecting the previously non-doped sacrificial semiconductor material layer portions 20L, 20R to a doping process. In one embodiment of the present disclosure, the doping process can be performed by forming a sacrificial dopant containing material layer (not shown in the drawings) adjacent to the sidewalls of non-doped sacrificial semiconductor material layer portions 20L, 20R, performing an anneal which drives dopant atoms from the sacrificial dopant containing material layer into sidewalls portions of non-doped sacrificial semiconductor material layer portions 20L, 20R, and then removing the sacrificial dopant containing material layer.

In another embodiment, the doping process that can be used to form the doped sacrificial semiconductor material portions 24L, 24R having a first width, w1, can be an angled ion implantation process. The angle of the implantation will depend on the height of each patterned sacrificial material stack 18L, 18R and the distance between each adjacent patterned sacrificial material stack. In one example, an angled ion implantation performed at angle between 10° and 40° can be used.

In yet another embodiment of the present disclosure, the doping process that can be used to form the doped sacrificial semiconductor material portions 24L, 24R having a first width, w1, may comprise a plasma doping process.

In one embodiment, the doped sacrificial semiconductor material portions 24L, 24R having a first width, w1, may include a p-type dopant. Examples of p-type dopants include an element from Group IIIA of the Periodic Table of Element, i.e., B, Al and/or In. In such an embodiment, a p-type dopant species is introduced into sidewall portions of each non-doped semiconductor material layer portion 20L, 20R utilizing one of the doping processes mentioned above. When a p-type dopant is present within the doped sacrificial semiconductor material portions 24L, 24R and in one embodiment of the present application, the concentration of p-type doped within the doped sacrificial semiconductor material portions 24L, 24R can be from 5e18 atoms/cm$^3$ to 5e20 atoms/cm$^3$. Other p-type dopant concentrations that are greater than or lesser than the range can be used so long as the dopant concentration within the doped sacrificial semiconductor material portions 24L, 24R has a different etch rate than that of the remaining non-doped sacrificial semiconductor material portions 21L, 21R.

In another embodiment, the doped sacrificial semiconductor material portions 24L, 24R having a first width, w1, may include an n-type dopant. Examples of n-type dopants include an element from Group VA of the Periodic Table of Element, i.e., P, As, and/or Sb. In such an embodiment, an n-type dopant species is introduced into sidewall portions of each non-doped semiconductor material layer portion 20L, 20R utilizing one of the doping processes mentioned above. When an n-type dopant is present within the doped sacrificial semiconductor material portions 24L, 24R and in one embodiment of the present application, the concentration of n-type doped within the doped sacrificial semiconductor material portions 24L, 24R can be from 5e18 atoms/cm$^3$ to 5e20 atoms/cm$^3$. Other n-type dopant concentrations that are greater than or lesser than the range can be used so long as the dopant concentration within the doped sacrificial semiconductor material portions 24L, 24R has a different etch rate than that of the remaining non-doped sacrificial semiconductor material portions 21L, 21R.

In one embodiment of the present application, the first width, w1, of doped sacrificial semiconductor material portions 24L, 24R can be from 5 nm to 50 nm. In another embodiment, the first width, w1, of the doped sacrificial semiconductor material portions 24L, 24R can be from 15 nm to 25 nm.

Figure 5:
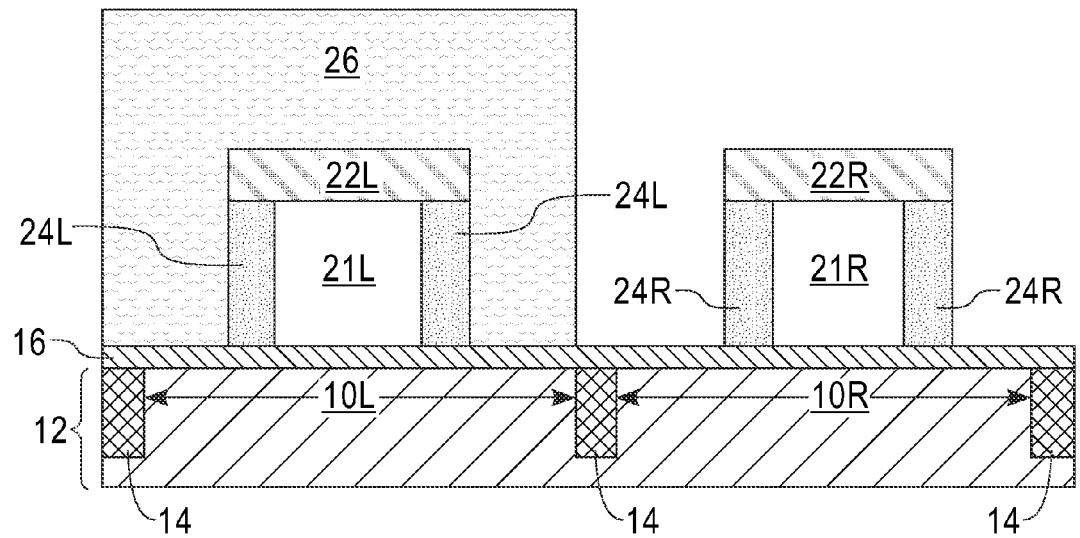
FIG. 5 is a pictorial representation (through a cross sectional view) illustrating the structure of FIG. 4 after forming a block mask over one of the active device regions.

Referring now to FIG. 5, there is illustrated the structure of FIG. 4 after forming a block mask 26 over one of the active device regions. In the drawing and by way of illustration, block mask 26 is formed over the first active device region 10L, while the second active device region 10R is left exposed. In another embodiment, block mask 26 could be formed over the second active device region 10R, while leaving the first active device region 10L exposed.

The block mask 26 that can be employed in the present application can be formed by deposition of a block mask material and then patterning the same. In one embodiment, a photoresist material can be used as the block mask material. When a photoresist material is employed as the block mask material, the photoresist material can be patterned by only lithography (i.e., exposing a blanket layer of photoresist material to a desired pattern of radiation and developing the exposed photoresist material). In another embodiment, the block mask material can be a dielectric material such as, for example, silicon oxide, or silicon nitride. In such an embodiment, the patterning of the dielectric material includes applying a photoresist atop the dielectric material, subjecting the photoresist to lithography, then transferring the pattern from the patterned resist to the underlying layer of dielectric material by etching, and thereafter removing the patterned photoresist material. The etch used to transfer the pattern from the patterned photoresist material to the underlying dielectric material may include a dry etching process or a chemical wet etch may be used.

Figure 6:
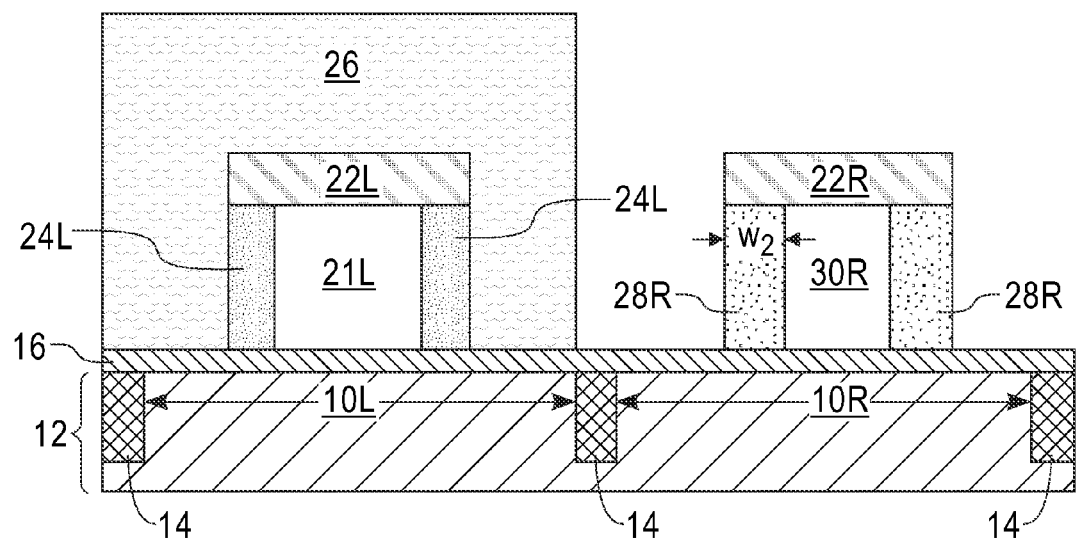
FIG. 6 is a pictorial representation (through a cross sectional view) illustrating the structure of FIG. 5 after widening the doped sacrificial semiconductor material portions within the active device region not including the block mask to have a second width that is greater than the first width.

Referring now to FIG. 6, there is illustrated the structure of FIG. 5 after widening the doped sacrificial semiconductor material portions within the active device region not including the block mask 26 to have a second width that is greater than the first width. In the embodiment illustrated, the doped sacrificial semiconductor material portions 24R within the second active device region 10R are widen to provide doped sacrificial semiconductor material portions 28R which have a second width, w2, which is greater than the first width.

The widening of the doped sacrificial semiconductor material portions within the active device region not including the block mask 26 to provide doped sacrificial semiconductor material portions 28R have a second width that is greater than the first width can be achieved utilizing one of the doping techniques mentioned above for forming the doped sacrificial semiconductor material portions 24L, 24R of the first width, w1. In one embodiment in which an angled implantation process is used, a high implant dose may be used in order to widening w1 of the exposed doped sacrificial semiconductor material portions to w2.

In one embodiment of the present application, the second width, w2, of doped sacrificial semiconductor material portions 28R can be from 20 nm to 100 nm. In another embodiment, the second width, w2, of the doped sacrificial semiconductor material portions 28 can be from 25 nm to 35 nm Like the doped sacrificial semiconductor material portions 24L, 24R having the first width, w1, each doped sacrificial semiconductor material portions 28R encases a remaining portion of non-doped sacrificial semiconductor material portion 30R.

In accordance with the present application, each non-doped semiconductor material portion 30L has a different width than the each non-doped semiconductor material portion 21L. For example, the width of, each non-doped semiconductor material portion 30L can be less than the width of each non-doped semiconductor material portion 21L.

The concentration of dopant within the doped semiconductor material portions 28R may be the same or greater than the concentration of dopant with doped semiconductor material portions 24L, 24R of the first width. It should be noted that the doped semiconductor material portions 24L, 24R having the first, w1, may be referred to herein as first doped semiconductor material portions having first width, w1, while the doped semiconductor material portions 28R having the second width, w2, may be referred herein as second doped semiconductor material portions having second width, w2.

Figure 7:
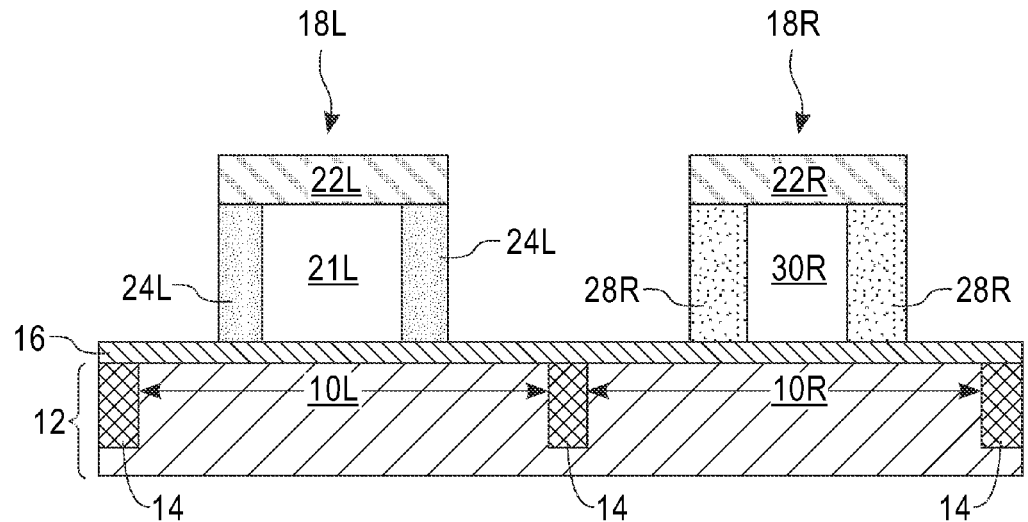
FIG. 7 is a pictorial representation (through a cross sectional view) illustrating the structure of FIG. 6 after removing the block mask from one of the active device regions.

Referring now to FIG. 7, there is illustrated the structure of FIG. 6 after removing the block mask 26 from one of the active device regions. In one embodiment, and when a photoresist material is employed as the block mask 26, a resist stripping process, such as, for example, ashing can be used to remove the block mask from the structure. In another embodiment, and when a dielectric material is employed as the block mask 26, an etching process can be used to remove the dielectric block mask from the structure.

Figure 8:
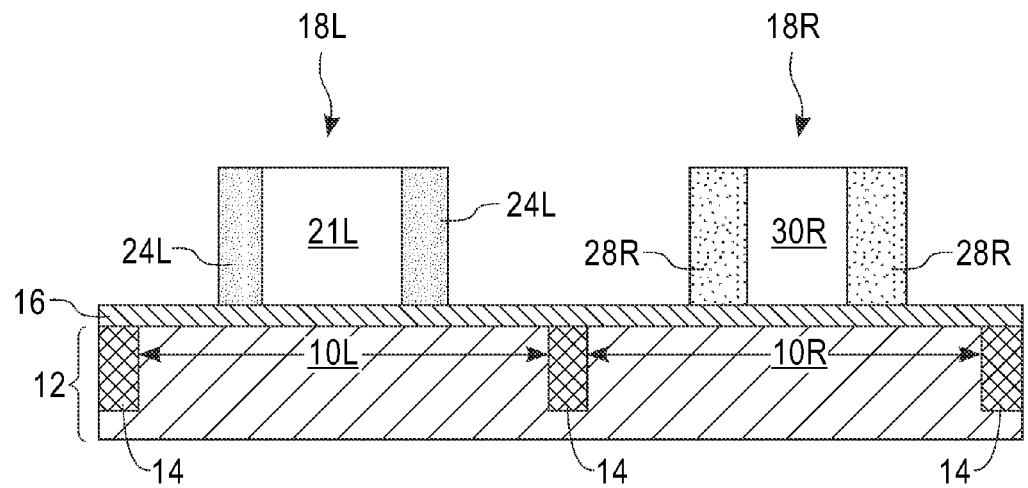
FIG. 8 is a pictorial representation (through a cross sectional view) illustrating the structure of FIG. 7 after removing a dielectric cap portion from atop the first and second patterned sacrificial material stacks.

Referring now to FIG. 8, there is illustrated the structure the structure of FIG. 7 after removing sacrificial dielectric cap portions 22L, 22R from atop the first and second patterned sacrificial material stacks which now are comprised of doped sacrificial semiconductor material portions 24L, 28R and non-doped semiconductor material portions 21L, 30R. This step of the present disclosure can be omitted when no sacrificial dielectric cap portions are present in the structure.

In one embodiment of the present application, and when present, the sacrificial dielectric cap portions 22L, 22R can be removed by chemical mechanical polishing. In another embodiment of the present application, and when present, the sacrificial dielectric cap portions 22L, 22R can be removed by removed by a selective etching process. In one example, and when the sacrificial dielectric cap portions 22L, 22R are comprised of silicon oxide, an etch solution containing hydrofluoric acid can be used to remove the sacrificial dielectric cap portions 22L, 22R.

As shown in FIG. 8, the removal of the sacrificial dielectric cap portions 22L, 22R from the structure exposes the uppermost surface of each of the first doped semiconductor material portions (i.e., element 24L) having first width, w1, the second doped semiconductor material portions (i.e., element 28R) having second width, w2, and remaining non-doped sacrificial semiconductor material portions 21L, 30R.

Figure 9:
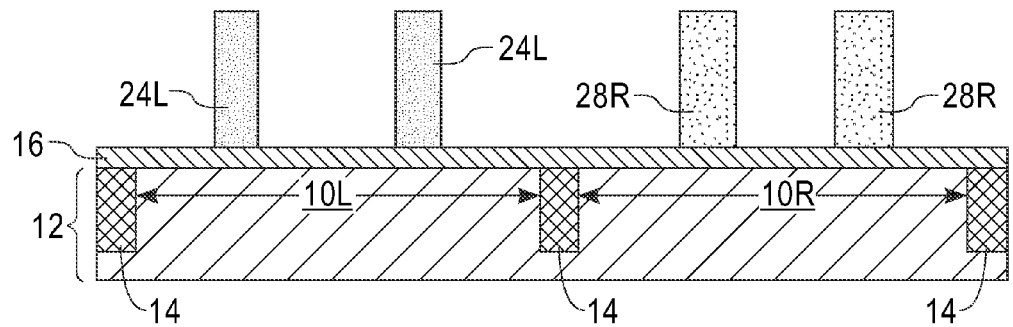
FIG. 9 is a pictorial representation (through a cross sectional view) illustrating the structure of FIG. 8 after removing remaining non-doped sacrificial semiconductor material portions selective to the doped sacrificial semiconductor material portions.

Referring now to FIG. 9, there is illustrated the structure of FIG. 8 after removing remaining non-doped sacrificial semiconductor material portions 21L, 30R selective to the doped sacrificial material portions (i.e., 24L and 28R). The resultant structure that is formed after removing the non-doped sacrificial semiconductor material portions 21L, 30R selective to the doped sacrificial material portions includes a plurality of first doped sacrificial semiconductor material portions 24L of a first width and a plurality of second doped sacrificial semiconductor material portions 28R of a second width, which is different from the first width.

The selective removal of the remaining non-doped sacrificial semiconductor material portions 21L, 30R selective to the doped sacrificial material portions (i.e., 24L and 28R) can be achieved utilizing a selective etch. By 'selective etch' it is meant that the rate of material removal for a first material, e.g., non-doped sacrificial semiconductor material portions 21L, 30R, is greater than the rate of removal for at least another material of the structure, e.g., the doped sacrificial material portions (i.e., 24L and 28R), to which the material removal process is being applied. For example, in one embodiment, a selective etch may include an etch chemistry that removes a first material selectively to a second material by a ratio of 10:1 or greater. In one embodiment, an ammonia etch may be employed to selectively etch the exposed and remaining non-doped sacrificial semiconductor material portions 21L, 30R, relative to the exposed doped sacrificial material portions (i.e., 24L and 28R).

Figure 10:
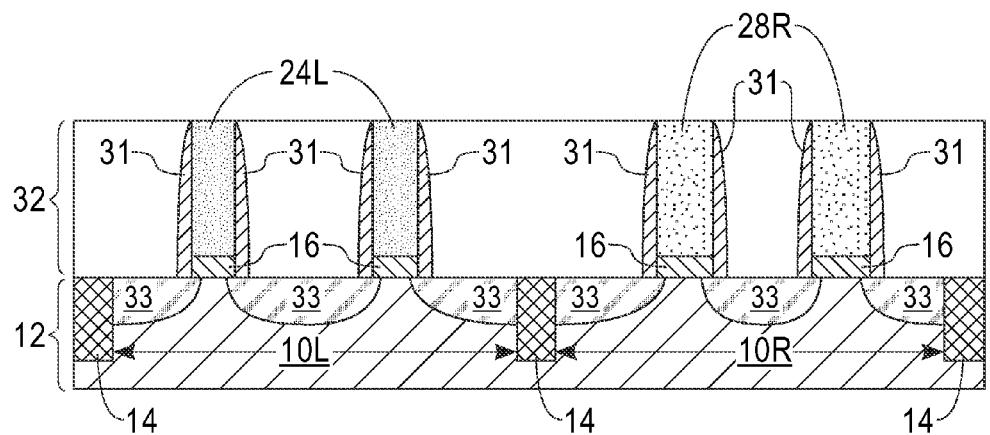
FIG. 10 is a pictorial representation (through a cross sectional view) illustrating the structure of FIG. 9 after removing exposed portions of the blanket layer of sacrificial dielectric material using each doped sacrificial semiconductor material portion as an etch mask, forming gate spacers and a dielectric material.

Referring now to FIG. 10, there is illustrated the structure of FIG. 9 after removing exposed portions of the blanket layer of sacrificial dielectric material 16 using each doped sacrificial semiconductor material portion 24L, 28R as an etch mask, forming gate spacers 31 and a dielectric material 32.

The exposed portions of the blanket layer of sacrificial dielectric material 16 can be removed by etching. In one embodiment of the present disclosure, a dry etching process such as, for example, reactive ion etching, can be used to remove the exposed portions of the blanket layer of sacrificial dielectric material 16. In another embodiment of the present application, a wet chemical etchant can be used to remove the exposed portions of the blanket layer of sacrificial dielectric material 16. In one example, an HF acid chemical etchant can be used to remove the exposed portions of the blanket layer of sacrificial dielectric material 16.

After removing the exposed portions of the blanket layer of sacrificial dielectric material 16, gate spacers 31 are formed on sidewalls of each of the remaining doped sacrificial semiconductor material portions 24L, 28R and directly on a surface of semiconductor substrate 12. The gate spacers 31 can be formed by first depositing a gate spacer material and then etching the deposited gate spacer material. Illustrative examples of gate spacer materials that can be employed in the present disclosure include a dielectric spacer material such as, for example, silicon oxide, silicon nitride and/or silicon oxynitride. The gate spacer material can be deposited using one of the techniques mentioned above in forming the sacrificial dielectric material 16, and then etching of the deposition spacer material can be performed by an anisotropic etch.

The thickness of the gate spacers 31, as measured from its base, can be from 1 nm to 10 nm. Other thicknesses that are lesser than or greater than the aforementioned range for the gate spacers 30 can also be employed in the present application.

After forming the gate spacers 31, source/drain regions 33 can be formed into the semiconductor substrate 10 by ion implantation. The implanted ions forming the source/drain regions 33 can be activated by a thermal activation process. In some embodiment, not shown, source/drain extension regions can be formed prior to forming the gate spacers 31.

After forming the source/drain regions 33, a dielectric material 32 is formed adjacent to the gate spacers 31 and adjacent to the remaining doped sacrificial semiconductor material portion 24L, 28R. The dielectric material 32 has an upper surface that is coplanar to the upper exposed surface of at least the doped sacrificial semiconductor material portion 24L, 28R. In some embodiments, the dielectric material 32 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present disclosure denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 30. The use of a self-planarizing dielectric material as dielectric material 32 may avoid the need to perform a subsequent planarizing step.

In one embodiment, the dielectric material 32 can be formed utilizing a conventional deposition process including, for example, chemical vapor deposition (CVD), plasma enhanced chemical vapor deposition (PECVD), evaporation and spin-on coating. In some embodiments, particularly when non-self-planarizing dielectric materials are used, a planarization process or an etch back process follows the deposition of the dielectric material 32. The thickness of the dielectric material 32 that can be employed in the present disclosure may vary depending on the type of dielectric material employed as well as the method that was employed in forming the same. In one embodiment, the dielectric material 32 has a thickness from 80 nm to 500 nm. Other thicknesses that are greater or lesser than the range provided above can also be used for the dielectric material 32.

Figure 11:
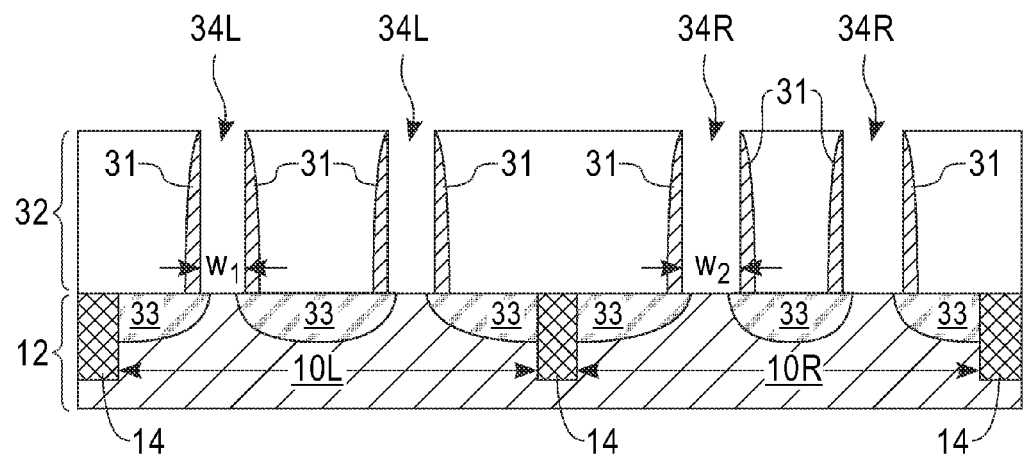
FIG. 11 is a pictorial representation (through a cross sectional view) illustrating the structure of FIG. 10 after forming gate cavities within the dielectric material by removing each doped sacrificial semiconductor material portion and remaining portions of the blanket layer of sacrificial dielectric material.

Referring now to FIG. 11, there is illustrated the structure of FIG. 10 after forming a gate cavity 34L, 34R within the dielectric material 32 by removing each remaining doped sacrificial semiconductor material portions 24L, 28R and remaining portions of the blanket layer of sacrificial dielectric material 16. In accordance with the present disclosure, each gate cavity 34L has a same width, i.e., w1, as the remaining doped sacrificial semiconductor material portion 24L, while each gate cavity 34R has a same width, i.e., w2, as the remaining doped sacrificial semiconductor material portion 28R.

Each remaining doped sacrificial semiconductor material portion 24L, 28R can be removed by etching. In one example, a reactive ion etch can be used to removal each doped sacrificial semiconductor material portion 24L, 28R from the structure. The underlying remaining portions of the blanket layer of sacrificial dielectric material 16 can be removed utilizing a second etch. In one embodiment, HF acid can be used to remaining portions of the blanket layer of sacrificial dielectric material 16.

Figure 12:
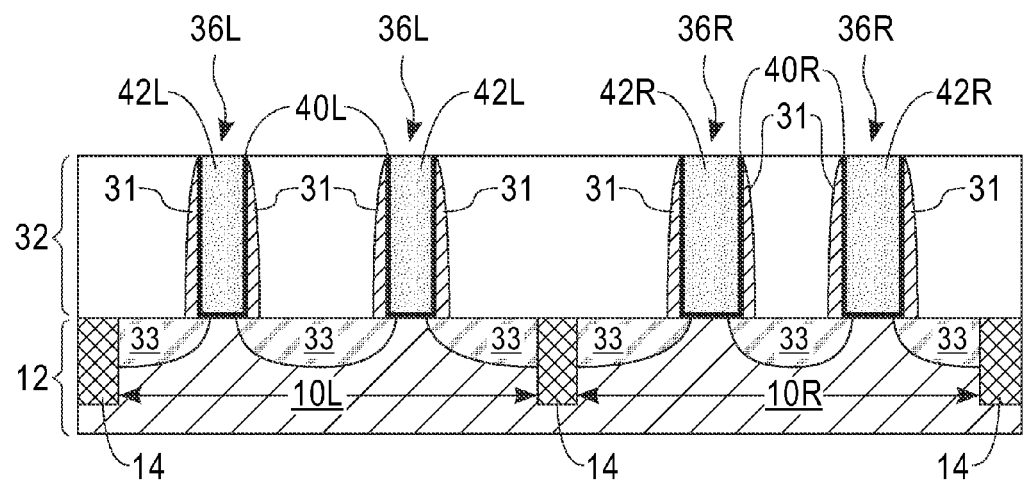
FIG. 12 is a pictorial representation (through a cross sectional view) illustrating the structure of FIG. 11 after forming a gate structure including a gate dielectric material portion and a gate conductor material portion within each gate cavity.

Referring now to FIG. 12, there is illustrated the structure of FIG. 11 after forming a gate structure 36L, 36R including a gate dielectric material portion 40L, 40R and a gate conductor material portion 42L, 42R within each gate cavity 34L, 34R. In one embodiment, and as shown, the gate dielectric material portion 40L, 40R is U-shaped having a bottommost portion in direct contact with a surface of the semiconductor substrate 12 and vertical portions that are located on exposed sidewalls of the gate spacer 31.

The gate structures 36L that are formed in gate cavities 34L have a gate length, $l_1$, that equals to w1, while the gate structures 36R that are formed in gate cavities 34R have a gate length, $l_2$, that equals to w2. Since w2 is greater than w1, the gate lengths $l_2$ of the gate structures 36R are greater than the gate length $l_1$ of the gate structures 36L.

The gate dielectric material portion 40L, 40R can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed.

The gate dielectric material portion 40L, 40R can be formed by any deposition technique including, for example, chemical vapor deposition (CVD), plasma enhanced chemical vapor deposition (PECVD), physical vapor deposition (PVD), and sputtering, atomic layer deposition. In one embodiment of the present application, the gate dielectric material portion 40L, 40R can have a thickness in a range from 1 nm to 10 nm. Other thicknesses that are lesser than or greater than the aforementioned thickness range can also be employed for the gate dielectric material portion 40L, 40R.

After providing the gate dielectric material portion 40L, 40R, the gate conductor material portion 42L, 42R can be formed atop the gate dielectric material portion 40L, 40R and filling the remaining space of each gate cavity 34L, 34R. The gate conductor material portion 42L, 42R can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor material portion 42L, 42R can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the gate conductor material portion 42L, 42R has a thickness from 1 nm to 100 nm. Other thicknesses that are lesser than or greater than the aforementioned thickness range can also be employed for the gate conductor material portion 42L, 42R.

In another embodiment, a block mask can be formed in one of the device regions, at least one first gate structure can be formed in the another of the device regions not including the block mask, the block mask is removed, another block mask is formed in the device region including the at least one first gate structure, at least one second gate structure can then be formed into the another device region, and the another block mask can be removed. This particular embodiment permits the formation of at least one first gate structure in one of the device regions that can have at least one different material portion, i.e., gate dielectric material portion and/or gate conductor portion, that differs from the gate dielectric material portion and/or gate conductor portion of the at least one second gate structure formed in the other device region.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    providing a structure comprising a semiconductor substrate having a first active device region and a second active device region, and a sacrificial dielectric material located on a surface of the semiconductor substrate in the first active device region and the second active device region;
    forming a non-doped sacrificial semiconductor material portion having a first doped sacrificial semiconductor material portion of a first width located on each sidewall of said non-doped sacrificial semiconductor material portion on a portion of the sacrificial dielectric material in each of the first active device region and the second active device region;
    forming a block mask on said first active device region, but not said second device region;
    widening the first doped sacrificial material portions within the second active device region to provide another non-doped sacrificial semiconductor material portion having a second doped sacrificial semiconductor material portion of a second width located on each sidewall of said another non-doped sacrificial semiconductor material portion on another portion of the sacrificial dielectric material and in the second active device region, wherein said second width is different than the first width;
    removing the block mask;
    removing the non-doped sacrificial semiconductor material portion and the another non-doped sacrificial semiconductor material portion selective to each first doped sacrificial semiconductor material portion and each second doped sacrificial semiconductor material portion;
    removing exposed portions of the sacrificial dielectric material not covered by each first doped sacrificial semiconductor material portion in the first active device region and each second first doped sacrificial semiconductor material portion in the second active device region;
    forming at least a dielectric material adjacent each first doped sacrificial semiconductor material portion and each second doped sacrificial semiconductor material portion, wherein the dielectric material has an upper surface that is coplanar with an upper surface of each first doped sacrificial semiconductor material portion and each second doped sacrificial semiconductor material portion;
    removing each first doped sacrificial semiconductor material portion and underlying sacrificial dielectric material from the first active device region providing first gate cavities having said first width, and each second doped sacrificial semiconductor material portion and underlying sacrificial dielectric material from the second active device region providing second gate cavities having said second width; and
    forming a gate structure in each of said first gate cavities and said second gate cavities.

2. The method of claim 1, wherein said providing the structure comprising:
    forming at least one isolation region within said semiconductor substrate; and
    depositing a blanket layer of the sacrificial dielectric material on at least exposed surfaces of the semiconductor substrate.

3. The method of claim 1, wherein said first width is from 5 nm to 50 nm, and said second width is from 20 nm to 100 nm.

4. The method of claim 1, wherein said non-doped sacrificial semiconductor material portion, said first doped sacrificial semiconductor material portion, said another non-doped sacrificial semiconductor material portion, and said second doped sacrificial semiconductor material portion comprises a same semiconductor material.

5. The method of claim 4, wherein said same semiconductor material comprises amorphous silicon or a silicon germanium alloy.

6. The method of claim 1, wherein said removing the non-doped sacrificial semiconductor material portion and the another non-doped sacrificial semiconductor material portion selective to each first doped sacrificial semiconductor material portion and each second doped sacrificial semiconductor material portion comprises a selective etch.

7. The method of claim 6, wherein said selective etch comprises an ammonia etch.

8. The method of claim 1, wherein said forming the least a dielectric material adjacent each first doped sacrificial semiconductor material portion and each second doped sacrificial semiconductor material portion comprises:
   deposition of a dielectric material; and
   planarizing or etching back said deposited dielectric material.

9. The method of claim 8, further comprising forming a gate spacer adjacent each first doped sacrificial semiconductor material portion and each second doped sacrificial semiconductor material portion prior to depositing the dielectric material.

10. The method of claim 1, wherein said removing each first doped sacrificial semiconductor material portion from the first active device region, and each second doped sacrificial semiconductor material portion from the second active device region comprises a reactive ion etch.

11. The method of claim 10, wherein said removing underlying portions of the sacrificial dielectric material comprises another etch.

12. The method of claim 1, wherein said forming the gate structure in each of said first gate cavities and said second gate cavities comprises deposition of a gate dielectric material portion and a gate conductor material portion.

13. The method of claim 12, wherein said gate dielectric material portion is U-shaped having vertical portions and a bottommost portion, wherein said bottommost portion of said gate dielectric material is in direct contact with a surface of the semiconductor substrate.

14. The method of claim 12, wherein said gate dielectric material portion and said gate conductor material portion each have upper surfaces that are coplanar with said dielectric material.

15. The method of claim 12, wherein each gate dielectric material portion comprises a dielectric material having a dielectric constant that is greater than silicon oxide, and each gate conductor portion comprises at least an elemental metal.

16. The method of claim 1, wherein each gate structure formed in the first gate cavities has a first gate length that equals the first width, and each gate structure is the second gate cavities has a second gate length that equals the second width.

17. A method of forming a semiconductor structure comprising:
   providing a structure comprising a semiconductor substrate having a first active device region and a second active device region, and a sacrificial dielectric material located on a surface of the semiconductor substrate in the first active device region and the second active device region;
   forming a non-doped sacrificial semiconductor material portion having a first doped sacrificial semiconductor material portion of a first width located on each sidewall of said non-doped sacrificial semiconductor material portion on a portion of the sacrificial dielectric material and in the first active device region, and another non-doped sacrificial semiconductor material portion having a second doped sacrificial semiconductor material portion of a second width located on each sidewall of said another non-doped sacrificial semiconductor material portion on another portion of the sacrificial dielectric material and in the second active device region, wherein said second width is different than the first width, wherein said forming comprises:
      forming a first patterned sacrificial material stack in the first active device region, and a second patterned sacrificial material stack in the second active device region, wherein each of the first and second patterned material stacks includes at least a non-doped sacrificial semiconductor material layer portion;
      introducing a dopant within sidewalls of each non-doped sacrificial semiconductor material layer portion of the first patterned sacrificial material stack and the second patterned sacrificial material stack to form said non-doped sacrificial semiconductor material portion having the first doped sacrificial semiconductor material portion of the first width located on each sidewall of said non-doped sacrificial semiconductor material portion in each of said first and second active device regions;
      forming a block mask on said first active device region;
      widening the first doped sacrificial material portion within the second active device region to provide said another non-doped sacrificial semiconductor material portion having the second doped sacrificial semiconductor material portion of the second width within the second active device region; and
      removing the block mask;
   removing the non-doped sacrificial semiconductor material portion and the another non-doped sacrificial semiconductor material portion selective to each first doped sacrificial semiconductor material portion and each second doped sacrificial semiconductor material portion;
   removing exposed portions of the sacrificial dielectric material not covered by each first doped sacrificial semiconductor material portion in the first active device region and each second first doped sacrificial semiconductor material portion in the second active device region;
   forming at least a dielectric material adjacent each first doped sacrificial semiconductor material portion and each second doped sacrificial semiconductor material portion, wherein the dielectric material has an upper surface that is coplanar with an upper surface of each first doped sacrificial semiconductor material portion and each second doped sacrificial semiconductor material portion;
   removing each first doped sacrificial semiconductor material portion and underlying sacrificial dielectric material from the first active device region providing first gate cavities having said first width, and each second doped sacrificial semiconductor material portion and underlying sacrificial dielectric material from the second active device region providing second gate cavities having said second width; and
   forming a gate structure in each of said first gate cavities and said second gate cavities.

18. The method of claim 17, wherein said introducing the dopants comprises:
   forming a sacrificial dopant containing material adjacent to the first and second patterned sacrificial material stacks, outdiffusing dopants from the sacrificial dopant containing material into portions of the first and second patterned material stacks, and removing the sacrificial dopant material.

19. The method of claim 17, wherein said introducing the dopants comprises an angled ion implantation process or plasma doping.

20. The method of claim 17, wherein said widening the first doped sacrificial material portions within the second active device region comprises an angled ion implantation process or plasma doping.

* * * * *